United States Patent
Kiyama et al.

Patent Number: 5,458,928
Date of Patent: Oct. 17, 1995

[54] METHOD OF FORMING METAL MATERIAL FILM WITH CONTROLLED COLOR CHARACTERISTIC

[75] Inventors: Seiichi Kiyama, Takatsuki; Hitoshi Hirano, Nishinomiya; Yoichi Domoto, Higashiosaka; Keiichi Kuramoto, Hirakata, all of Japan

[73] Assignee: Sanyo Electric Co., Ltd., Osaka, Japan

[21] Appl. No.: 70,726

[22] Filed: Jun. 2, 1993

[30] Foreign Application Priority Data

Jun. 3, 1992 [JP] Japan ................. 4-142745

[51] Int. Cl.$^6$ ............... B05A 3/06; C23C 16/00
[52] U.S. Cl. ............. 427/530; 427/531; 427/566; 427/248.1; 427/255.3; 427/294; 204/192.16
[58] Field of Search ............. 427/566, 255.3, 427/248.1, 294, 530, 531; 204/192.16

[56] References Cited

U.S. PATENT DOCUMENTS

| | | | |
|---|---|---|---|
| 2,539,149 | 1/1951 | Miller | 117/107 |
| 3,900,636 | 8/1975 | Curry et al. | 427/38 |
| 4,861,669 | 8/1989 | Gillery | 428/434 |
| 4,920,006 | 4/1990 | Gillery | 428/432 |
| 4,933,058 | 6/1990 | Bache et al. | 204/192.3 |
| 4,938,857 | 7/1990 | Gillery | 204/192.27 |
| 5,053,245 | 10/1991 | Kiyamo et al. | 427/38 |
| 5,064,682 | 11/1991 | Kiyama et al. | 427/38 |

FOREIGN PATENT DOCUMENTS

| | | | |
|---|---|---|---|
| 63-382 | 1/1987 | Japan | B26B 19/14 |

*Primary Examiner*—Benjamin L. Utech
*Attorney, Agent, or Firm*—W. G. Fasse; W. F. Fasse

[57] ABSTRACT

The disclosed method of forming a high-function material film such as a ZrN thin film on a substrate in a vacuum chamber allows the color tone and uniformity of the film to be controlled. Gaseous nitrogen and gaseous oxygen, or nitrogen ions and oxygen ions, are supplied to the substrate while hard material atoms such as Zr atoms are emitted from an evaporation source toward the substrate. A supply partial pressure of the gaseous oxygen is set at a value within a range from about $10^{-5}$ Torr to about $10^{-4}$ Torr.

22 Claims, 3 Drawing Sheets

METHOD OF FORMING METAL MATERIAL FILM WITH CONTROLLED COLOR CHARACTERISTIC

BACKGROUND OF THE INVENTION

1. Field of the Invention

The present invention relates to a method of forming a high-function material film such as a metal material film having high hardness, which can be applied to a cutter such as an edge of an electric shaver.

2. Description of the Background Art

Studies have been conducted in relation to an electric shaver cutter, regarding a method of forming a hard mixed layer of titanium etc. on a surface of a base material for preparing a shaver edge. For example, Japanese Patent Laying-Open No. 62-382 (1987) discloses a method of vacuum-depositing titanium on a cutting edge of a polymer material with ion implantation of argon ions, thereby forming a hard layer of titanium.

While this publication discloses conditions such as deposition conditions, an ion acceleration voltage, an ion implantation rate etc. for effectively carrying out the vacuum deposition and ion implantation, there is no disclosure regarding a relation between these conditions and the color tone of the cutting edge. Thus, there has not been a sufficient study generally regarding such a relation between conditions for forming a film of high hardness on a cutting edge and the color tone of the cutting edge. However, the appearance and the color of a product are extremely important factors which determine the commercial value of the product for the consumer. Thus, it is important to control the color of such a hard film which is formed on an edge of an electric shaver.

SUMMARY OF THE INVENTION

An object of the present invention is to provide a method of forming a high-function material film of high hardness, which has a desired color tone with no color irregularity, on a base material such as an edge of an electric shaver.

The present invention provides a method of forming a high-function material film, which is composed of hard material atoms such a metal atoms, nitrogen and oxygen, on a substrate in a vacuum chamber.

A film forming method according to a first aspect of the present invention comprises a step of supplying gaseous nitrogen and gaseous oxygen into a vacuum chamber, and a step of emitting hard material atoms from an evaporation source toward a substrate in the atmosphere of the gaseous nitrogen and the gaseous oxygen that are supplied. The supply partial pressure of the gaseous oxygen is set at a value of not more than about $10^{-4}$ Torr.

A film forming method according to a second aspect of the present invention comprises a step of supplying gaseous nitrogen and gaseous oxygen to an assist gun and injecting nitrogen ions and oxygen ions from the assist gun toward a substrate, and a step of emitting hard material atoms from an evaporation source toward the substrate together with the injection of the nitrogen ions and the oxygen ions. The gaseous oxygen is supplied to the assist gun at a partial pressure which is set at a value of not more than about $10^{-4}$ Torr.

According to the present invention, the supply partial pressure of the gaseous oxygen is not more than about $10^{-4}$ Torr as described above, and more preferably, in a range of about $10^{-5}$ to $10^{-4}$ Torr.

Further according to the present invention, on the other hand, the supply partial pressure of the gaseous nitrogen is preferably in a range of about $0.4 \times 10^{-4}$ to $1.5 \times 10^{-4}$ Torr, and more preferably, about $0.8 \times 10^{-4}$ Torr.

A high-function material film which is formed according to the present invention is made of a nitride further containing oxygen. According to the present invention, it is possible to form a ZrN film containing oxygen (hereinafter simply referred to as "ZrN film") or a TiN film containing oxygen (hereinafter simply referred to as "TiN film"), for example.

According to the present invention, the gaseous oxygen is supplied into the vacuum chamber or to the assist gun at a partial pressure which is set at a value not more than about $10^{-4}$ Torr, because then it is possible to adjust or vary the transparency and the color tone of the as-formed film among various colors ranging from gold to an interference color by adjusting the supply partial pressure. Further, color difference or variation is reduced when the supply partial pressure of the gaseous oxygen is not more than $1 \times 10^{-4}$ Tort. Thus, when the gaseous oxygen is supplied at a partial pressure of not more than $1 \times 10^{-4}$ Torr, an undesired color irregularity will not be caused even if the supply partial pressure varies, due to the small color difference below that pressure.

According to the present invention, therefore, it is possible to change the color tone of the film by changing the supply partial pressure of the gaseous oxygen and thereby varying the transparency, while it is also possible to reduce the color difference, for forming a film having no color irregularity.

The foregoing and other objects, features, aspects and advantages of the present invention will become more apparent from the following detailed description of the present invention when taken in conjunction with the accompanying drawings.

DETAILED OF THE PREFERRED EMBODIMENTS OF THE INVENTION

Examples of the present invention for forming ZrN (zirconium nitride) films to be applied to edges of electric shaver cutters will now be described. In the present invention, an edge of an electric cutter includes a foil and an inner blade of the same.

Figure 1:
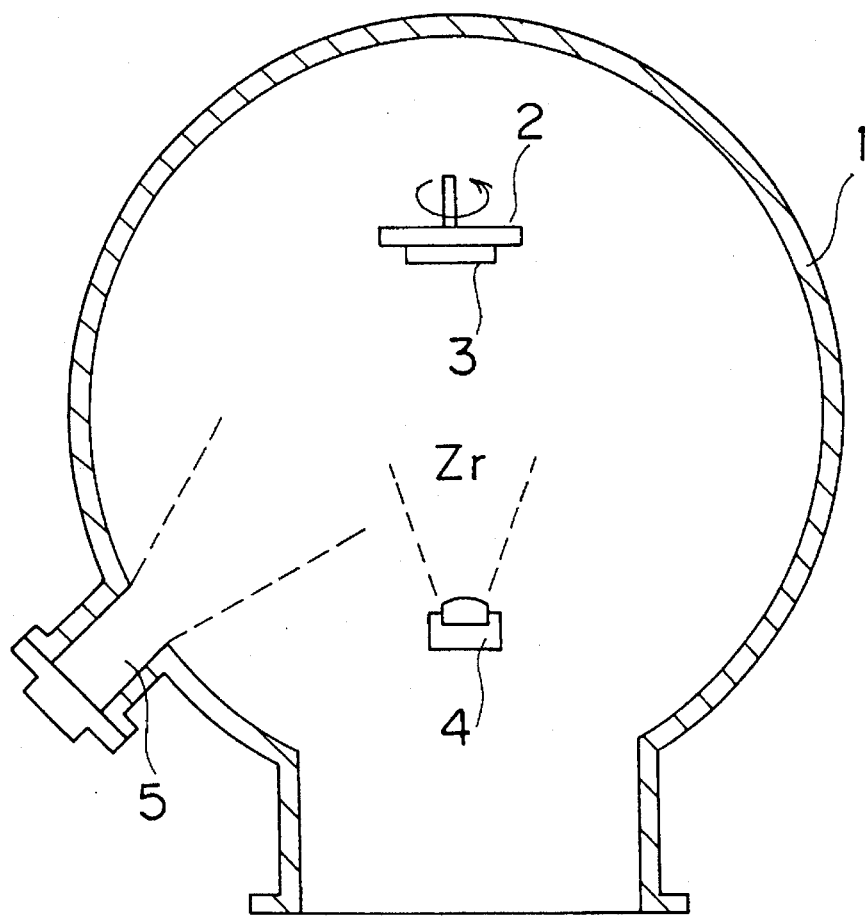
FIG. 1 is a schematic view in partial section showing a film forming apparatus employed in first to third Examples of the present invention.

FIG. 1 is a general schematic view showing a vacuum deposition and ion implantation apparatus employed for forming ZrN films in first to third Examples of the present invention as described below. Referring to FIG. 1, a substrate holder 2 is provided in a vacuum chamber 1. This vacuum chamber 1 can be evacuated to $10^{-5}$ to $10^{-7}$ Torr. The substrate holder 2 is rotatable as shown by the arrow in FIG. 1 at a speed of 10 to 20 r.p.m. A substrate 3 of nickel (Ni) is provided on the substrate holder 2. The vacuum chamber 1 is provided therein with an evaporation source 4, which evaporates zirconium (Zr) atoms, serving as hard material atoms, using an electron beam, and emits the atoms toward the substrate 3. The vacuum chamber 1 is further provided with an assist gun 5, which can inject nitrogen ions ($N^+$) and oxygen ions ($O^+$) or supply gaseous nitrogen ($N_2$) and gaseous oxygen ($O_2$) into the vacuum chamber 1.

A first Example for forming a thin film according to a first aspect of the present invention with the apparatus shown in FIG. 1 will now be described.

First Example

According to this Example, Zr hard material atoms were emitted from the evaporation source 4 toward the substrate 3 in a prescribed gas atmosphere, thereby forming a film. The gas was prepared from mixed gas of $N_2$ and $O_2$, which were supplied from the assist gun 5.

First, $N_2$ gas and $O_2$ gas were supplied from the assist gun 5 into the vacuum chamber 1, to have partial pressures of $0.8 \times 10^{-4}$ Torr and $1.0 \times 10^{-4}$ Torr respectively.

Then, the evaporation source 4 was driven to evaporate Zr atoms, serving as hard material atoms, and emit the same toward the surface of the substrate 3. At this time, the evaporation rate for the Zr atoms was set at 650 Å/min. in terms of the film forming rate on the substrate 3. Thus, the Zr atoms reacted with the $N_2$ gas and the $O_2$ gas, to form a ZrN film on the substrate 3.

The aforementioned process was carried out for about 4 minutes and 30 seconds, to form a ZrN film of about 0.3 μm thickness on the surface of the substrate 3. This ZrN film was a translucent thin film, which exhibited Vickers hardness of 1400 Hv. The Vickers hardness was measured on the basis of JIS G0202.

A second Example for forming a thin film according to a second aspect of the present invention with the apparatus shown in FIG. 1 will now be described.

Second Example

According to this Example, assist gas ions were injected toward the substrate 3 while Zr atoms, serving as hard material atoms, were simultaneously emitted from the evaporation source 4 toward the substrate 3, to form a film of Zr atoms, which were effected by the gas ions, on the surface of the substrate 3.

Referring to FIG. 1, the vacuum chamber 1 was evacuated to $10^{-5}$ to $10^{-7}$ Torr. Then $N_2$ gas and $O_2$ gas were supplied to the assist gun 5 to have partial pressures of $0.8 \times 10^{-4}$ Torr and $1 \times 10^{-4}$ Torr respectively. $N^+$ ions and $O^+$ ions were extracted from the $N_2$ gas and the $O_2$ gas which were thus supplied to the assist gun 5, and injected toward the surface of the substrate 3. At this time, the $N^+$ ions and the $O^+$ ions were injected at an acceleration voltage of 250 eV with an ion current density of 0.2 mA/cm$^2$.

The evaporation source 4 was driven simultaneously with the injection of the $N^+$ ions and the $O^+$ ions, to evaporate Zr atoms and emit the same toward the surface of the substrate 3. At this time, the Zr atoms were evaporated at a rate which was set to be 650 Å/min. in terms of the film forming rate on the substrate 3.

The aforementioned process was carried out for about 4 minutes and 30 seconds, to form a ZrN film of about 0.3 μm in thickness on the surface of the substrate 3. Similarly to the First Example, this ZrN film was also a translucent thin film, which exhibited Vickers hardness of 1450 Hv.

A Third Example for forming a first thin film layer according to the second aspect of the present invention and thereafter forming a second thin film layer on the first thin film layer according to the first aspect of the present invention with the apparatus shown in FIG. 1 will now be described.

Third Example

Referring to FIG. 1, the vacuum chamber 1 was evacuated to $10^{-5}$ to $10^{-7}$ Torr. $N_2$ gas and $O_2$ gas were supplied to the assist gun 5 to have partial pressures of $0.8 \times 10^{-4}$ Torr and $1 \times 10^{-4}$ Torr respectively. $N^+$ ions and $O^+$ ions were extracted from the $N_2$ gas and the $O_2$ gas which were thus supplied to the assist gun 5, and injected toward the surface of the substrate S. At this time, the $N^+$ ions and the $O^+$ ions were injected at an acceleration voltage of 700 eV with an ion current density of 0.38 mA/cm$^2$.

The evaporation source 4 was driven simultaneously with the injection of the $N^+$ ions and the $O^+$ ions, to evaporate Zr atoms, serving as hard material atoms, and emit the same toward the surface of the substrate 3. At this time, the Zr atoms were evaporated at a rate which was set to be 650 Å/min. in terms of the film forming rate on the substrate 3.

Figure 2:
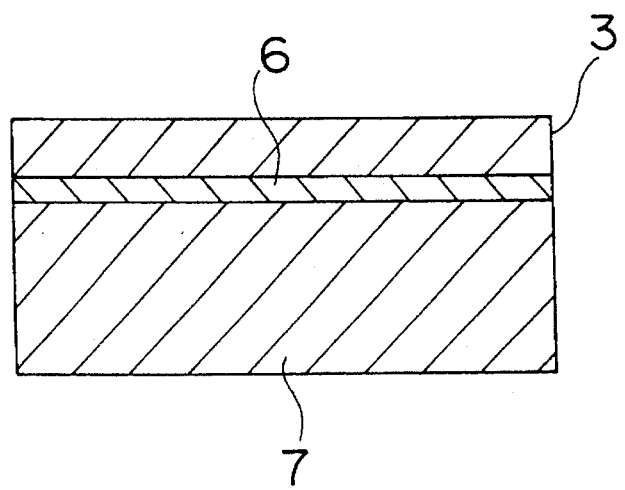
FIG. 2 is a sectional view showing a film formed according to the third Example of the present invention.

FIG. 2 is a sectional view showing a thin film formed according to the Third Example 3. Referring to FIG. 2, a first thin film layer 6 of 0.025 to 0.05 μm thickness was formed on the substrate 3 through the aforementioned process.

Then, the injection of the $N^+$ ions and the $O^+$ ions was stopped so that non-ionized $N_2$ gas and $O_2$ gas were supplied into the vacuum chamber 1, while Zr atoms were emitted from the evaporation source 4 toward the surface of the first thin film layer 6, which was provided on the substrate 3, in this gas atmosphere. At this time, the Zr atoms were evaporated at a rate which was set to be 650 Å/min. in terms of the film formation rate on the surface of the first thin film layer 6.

Referring to FIG. 2, a second thin film layer 7 of ZrN having a thickness of 0.26 to 0.29 μm was formed on the surface of the first thin film layer 6 of ZrN through the aforementioned process. Thus, a ZrN film having a thickness of about 0.3 μm in total was formed on the substrate 3. This film was a translucent thin film, which exhibited Vickers hardness of about 1500 Hv.

Figure 3:
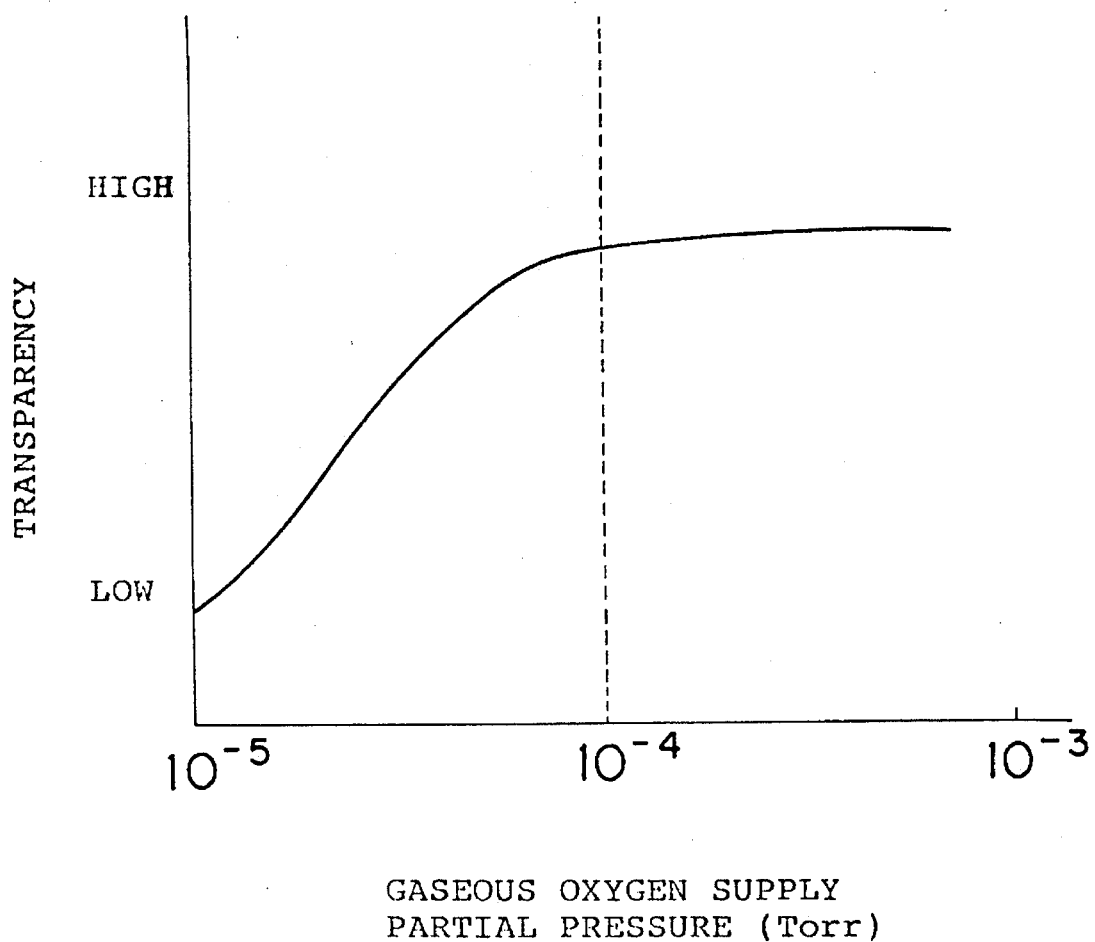
FIG. 3 illustrates a relation between the supply partial pressure of gaseous oxygen in the formation of a ZrN film and the transparency of the as-formed film.
Figure 4:
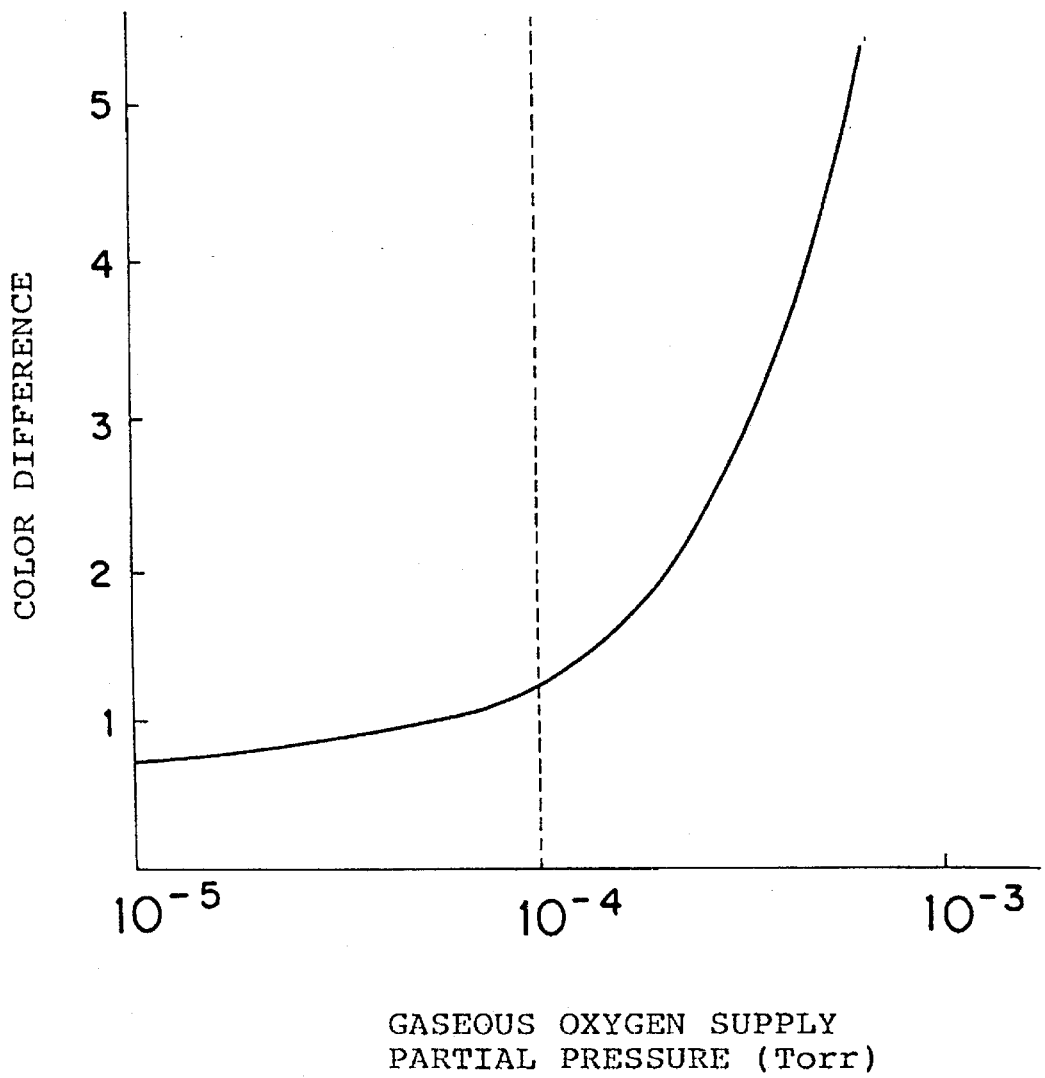
FIG. 4 illustrates a relation between the supply partial pressure of gaseous oxygen in the formation of the ZrN film and the color difference in the as-formed film.

Next ZrN films were formed using each of the methods described in the first to third Examples while changing the supply partial pressure of gaseous oxygen. FIGS. 3 and 4 show changes of transparency and color difference dependent on the change of partial pressure of gaseous oxygen measured in the as-obtained thin film. In formation of the thin film, a supply partial pressure of gaseous nitrogen was set at $0.8 \times 10^{-4}$ Torr.

The values of transparency shown in FIG. 3 were evaluated from transmission factors which were measured with a spectrometer. As shown in FIG. 3, transparency of the ZrN film was increased in proportion to the supply partial pressure of gaseous oxygen, up to a value of $1 \times 10^{-4}$ Torr. When the supply partial pressure of the gaseous oxygen exceeded $1 \times 10^{-4}$ Torr, however, substantially no further change was recognized in the transparency. For example, the ZrN film exhibited a color tone of gold with low transparency when the supply partial pressure of the gaseous oxygen was extremely low, while the same exhibited a color tone of an interference color with high transparency when the supply partial pressure of the gaseous oxygen was $1 \times 10^{-4}$ Torr. When the supply partial pressure of gaseous oxygen is not more than $1 \times 10^{-4}$ Torr, therefore, it is possible to vary the color tone of the as-formed film with the supply partial pressure, among various colors ranging from gold to an interference color.

FIG. 4 shows values of the color difference between two portions located about 10 cm from each other on the surface of the substrate provided with the ZrN film. The color difference was evaluated in CIELAB (CIE (L*a*b*) uniform color space prescribed by Commission Internationale de l'Eclairage (International Commission on Illumination)). Referring to the color difference shown in FIG. 4, numeral 1 represents a degree of barely distinguishable visual color difference, and numeral 5 represents a degree of clearly distinguishable visual color difference. When the value of color difference exceeds a degree 10, it means that the two colors as evaluated are absolutely different from each other. Thus, it is possible to determine whether or not the film has visually recognizable color irregularity, from the value of such color difference.

As shown in FIG. 4, the ZrN film exhibited a small color difference value of about 1 when the supply partial pressure of the gaseous oxygen was not more than $1 \times 10^{-4}$ Torr. On the other hand, the color difference was abruptly increased when the supply partial pressure of the gaseous oxygen exceeded $1 \times 10^{-4}$ Torr. Therefore, when the supply partial pressure of gaseous oxygen is not more than $1 \times 10^{-4}$ Torr, substantially no color irregularity is visually recognized, with a color difference of about 1, even if the supply partial pressure is changed. When the supply partial pressure of gaseous oxygen exceeds $1 \times 10^{-4}$ Torr, however, the color difference is abruptly increased with increase of the supply partial pressure, to disadvantageously cause clearly visual color irregularity.

As clearly understood from the results shown in FIGS. 3 and 4, therefore, it is possible to vary the transparency varying the supply partial pressure of gaseous oxygen for changing the color tone when the supply partial pressure is not more than $\times 10^{-4}$ Torr, while it is also possible to reduce color differences in the as-formed film, thereby preventing the film from having a color irregularity. When the supply partial pressure of the gaseous oxygen exceeds $1 \times 10^{-4}$ Torr, on the other hand, substantially no change is recognized in the color tone, while the color difference or irregularity is so increased that it is difficult to adjust the color tone.

While the supply partial pressure of the gaseous nitrogen was set at $0.8 \times 10^{-4}$ Torr in formation of the film evaluated as shown in FIGS. 3 and 4, tendencies substantially similar to the above were also recognized when the nitrogen supply partial pressure was set at other values. In particular, values similar to the results shown in FIGS. 3 and 4 were obtained when the supply partial pressure of the gaseous nitrogen was in a range of $0.4 \times 10^{-4}$ to $1.5 \times 10^{-4}$ Torr.

Although each of the above Examples has been described with reference to a ZrN film which was formed by evaporating Zr atoms serving as hard material atoms, it was also possible to obtain a similar result when Ti atoms were evaporated to form a TiN film according to the present invention.

According to the present invention, as hereinabove described, it is possible to form a high-function material film having a desired color tone with no color irregularity on a base material such as a cutter, by controlling the supply partial pressure of gaseous oxygen during formation of the film. When the present invention is applied to a cutter edge such as the cutter of an electric shaver, therefore, it is possible to manufacture a value-added product.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a film of metal atoms, nitrogen and oxygen on a substrate in a vacuum chamber, said method comprising the steps of: supplying gaseous nitrogen and gaseous oxygen into said vacuum chamber; establishing and maintaining a supply partial pressure of said gaseous oxygen within a range from about $10^{-5}$ Torr to about $10^{-4}$ Torr for controlling a resultant color tone or color uniformity of said film; and emitting said metal atoms from an evaporation source toward said substrate in an atmosphere of said supplied gaseous nitrogen and gaseous oxygen.

2. The method in accordance with claim 1, further comprising establishing and maintaining a supply partial pressure of said gaseous nitrogen within a range from about $0.4 \times 10^{-4}$ Torr to about $1.5 \times 10^{-4}$ Torr.

3. The method in accordance with claim 2, wherein said supply partial pressure of said gaseous nitrogen is about $0.8 \times 10^{-4}$ Torr.

4. The method in accordance with claim 1, wherein said film is made of a nitride and oxygen.

5. The method in accordance with claim 1, wherein said metal atoms are Zr atoms.

6. The method in accordance with claim 1, wherein said metal atoms are Ti atoms.

7. The method of claim 1, further comprising a preliminary step of evacuating said vacuum chamber to a pressure of from about $10^{-5}$ Torr to about $10^{-7}$ Torr.

8. The method of claim 1, further comprising adjusting said supply partial pressure of said gaseous oxygen to adjust a color tone or color uniformity of said film.

9. The method of claim 8, wherein said step of adjusting said supply partial pressure of said gaseous oxygen is carried out to achieve a color tone of said film other than gold.

10. The method of claim 1, wherein said substrate is a metallic substrate.

11. The method of claim 10, further comprising a step of providing said substrate in the form of a shaver foil.

12. A method of forming a film of metal atoms, nitrogen and oxygen on a substrate in a vacuum chamber, said method comprising the steps of: supplying gaseous nitrogen and gaseous oxygen to an assist gun and injecting nitrogen ions and oxygen ions from said assist gun toward said substrate; establishing and maintaining a supply partial pressure of said gaseous oxygen to said assist gun within a range from about $10^{-5}$ Torr to about $10^{-4}$ Torr for controlling a resultant color tone or color uniformity of said film; and emitting said metal atoms from an evaporation source toward said substrate with said injection of said nitrogen ions and said oxygen ions.

13. The method in accordance with claim 12, further comprising establishing and maintaining a supply partial pressure of said gaseous nitrogen within a range from about $0.4 \times 10^{-4}$ Torr to about $1.5 \times 10^{-4}$ Torr.

14. The method in accordance with claim 13, wherein said supply partial pressure of said gaseous nitrogen is about $0.8 \times 10^{-4}$ Torr.

15. The method in accordance with claim 12, wherein said film is made of a nitride and oxygen.

16. The method in accordance with claim 12, wherein said metal atoms are Zr atoms.

17. The method in accordance with claim 12, wherein said metal atoms are Ti atoms.

18. The method of claim 12, further comprising a preliminary step of evacuating said vacuum chamber to a pressure of from about $10^{-5}$ Torr to about $10^{-7}$ Torr.

19. The method of claim 10, further comprising adjusting said supply partial pressure of said gaseous oxygen to adjust a color tone or color uniformity of said film.

20. The method of claim 19, wherein said step of adjusting said supply partial pressure of said gaseous oxygen is carried out to achieve a color tone of said film other than gold.

21. The method of claim 12, wherein said substrate is a metallic substrate.

22. The method of claim 21, further comprising a step of providing said substrate in the form of a shaver foil.

* * * * *

UNITED STATES PATENT AND TRADEMARK OFFICE
CERTIFICATE OF CORRECTION

PATENT NO. : 5,458,928
DATED : Oct. 17, 1995
INVENTOR(S) : Kiyama et al.

It is certified that error appears in the above-indentified patent and that said Letters Patent is hereby corrected as shown below:

On the title page, item

[54], line 3, replace "CHARACTERISTIC" by --CHARACTERISTICS--.
Col. 2, line 22, replace "Tort" by --Torr--.
Col. 3, line 53, after "gas" (second occurrence) insert --,--, delete "thus".
Col. 4, line 18, replace "S" by --3--;
    line 28, delete "3".
Col. 7, line 6, replace "claim 10" by --claim 12--.

Signed and Sealed this

Ninth Day of April, 1996

Attest:

BRUCE LEHMAN

Attesting Officer     Commissioner of Patents and Trademarks